(12) United States Patent
Park et al.

(10) Patent No.: US 7,984,261 B2
(45) Date of Patent: Jul. 19, 2011

(54) MEMORY EXPANSION STRUCTURE IN MULTI-PATH ACCESSIBLE SEMICONDUCTOR MEMORY DEVICE

(75) Inventors: Sang-Kyun Park, Gyeonggi-do (KR); Il-Man Bae, Gyeonggi-do (KR); Han-Gu Sohn, Gyeonggi-do (KR); Yun-Hee Shin, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1197 days.

(21) Appl. No.: 11/614,877

(22) Filed: Dec. 21, 2006

(65) Prior Publication Data
US 2007/0208902 A1    Sep. 6, 2007

(30) Foreign Application Priority Data
Dec. 22, 2005    (KR) .................. 10-2005-0127527

(51) Int. Cl.
*G06F 12/00* (2006.01)
(52) U.S. Cl. ........................................ 711/170; 711/149
(58) Field of Classification Search .................. 710/100, 710/300, 305, 313; 709/214, 212, 213; 711/147, 711/148, 149, 170, 173
See application file for complete search history.

(56) References Cited

U.S. PATENT DOCUMENTS

| | | | | |
|---|---|---|---|---|
| 5,680,365 A | * | 10/1997 | Blankenship | ............ 365/230.05 |
| 6,839,739 B2 | * | 1/2005 | Wilson | .......................... 709/213 |
| 2003/0093628 A1 | | 5/2003 | Matter et al. | |
| 2004/0107264 A1 | | 6/2004 | Nishida | |
| 2005/0066067 A1 | | 3/2005 | Suh | |
| 2008/0144270 A1 | * | 6/2008 | Dal Porto et al. | ............. 361/684 |

FOREIGN PATENT DOCUMENTS

| | | |
|---|---|---|
| JP | 10-161866 | 6/1998 |
| JP | 2005-020088 | 2/2005 |
| JP | 2005-50088 | 2/2005 |
| KR | 1994-22284 | 10/1994 |
| KR | 1997-51155 | 7/1997 |
| KR | 2000-49908 | 8/2000 |
| KR | 2002-58322 | 7/2002 |
| KR | 2005-58322 | 7/2002 |
| KR | 2005-29104 | 3/2005 |

\* cited by examiner

*Primary Examiner* — Jared I Rutz
(74) *Attorney, Agent, or Firm* — Stanzione & Kim, LLP (57) ABSTRACT

A multiprocessor system includes a first processor coupled to a first bus, a second processor coupled to a second bus, a first memory coupled to the first bus and the second bus, and a second memory coupled to the second bus. The first processor is configured to access the first memory through the first bus, and the second processor is configured to access the first memory and the second memory through the second bus.

11 Claims, 8 Drawing Sheets

MEMORY EXPANSION STRUCTURE IN MULTI-PATH ACCESSIBLE SEMICONDUCTOR MEMORY DEVICE

CROSS-REFERENCE TO RELATED APPLICATION

This application claims the benefit of Korean Patent Application No. 10-2005-127527, filed Dec. 22, 2005, the disclosure of which is hereby incorporated herein by reference in its entirety.

BACKGROUND

1. Technical Field

This disclosure relates to a semiconductor memory device, and more particularly, to a memory expansion structure in a multi-path accessible semiconductor memory device suitable to be employed to a mobile communication system.

2. Discussion of Related Art

In general, a semiconductor memory device having multiple access ports is called a multi-port memory. In particular, a memory device having two access ports is called a dual port memory. A typical dual port memory is an image processing video memory having a random access memory (RAM) port accessible in a random sequence and a serial access memory (SAM) port accessible in a serial sequence, which is widely known in the present field.

In this disclosure, a dynamic random access memory (DRAM) for reading and writing a shared memory region of a memory cell array made up of DRAM cells through multiple access ports without the SAM port, unlike a configuration of a video memory, will be herein referred to as a multi-path accessible semiconductor memory device in order to distinguish from the multi-port memory.

The use of electronic systems in current societies has expanded ubiquitously. In order to insure high-speeds and smooth functionality or operation in portable electronic systems and electronic appliances, such as notebook computers, hand-held phones and personal digital assistants (PDAs), for example, manufacturers have used multiprocessor systems as shown in FIG. 1.

Figure 1:
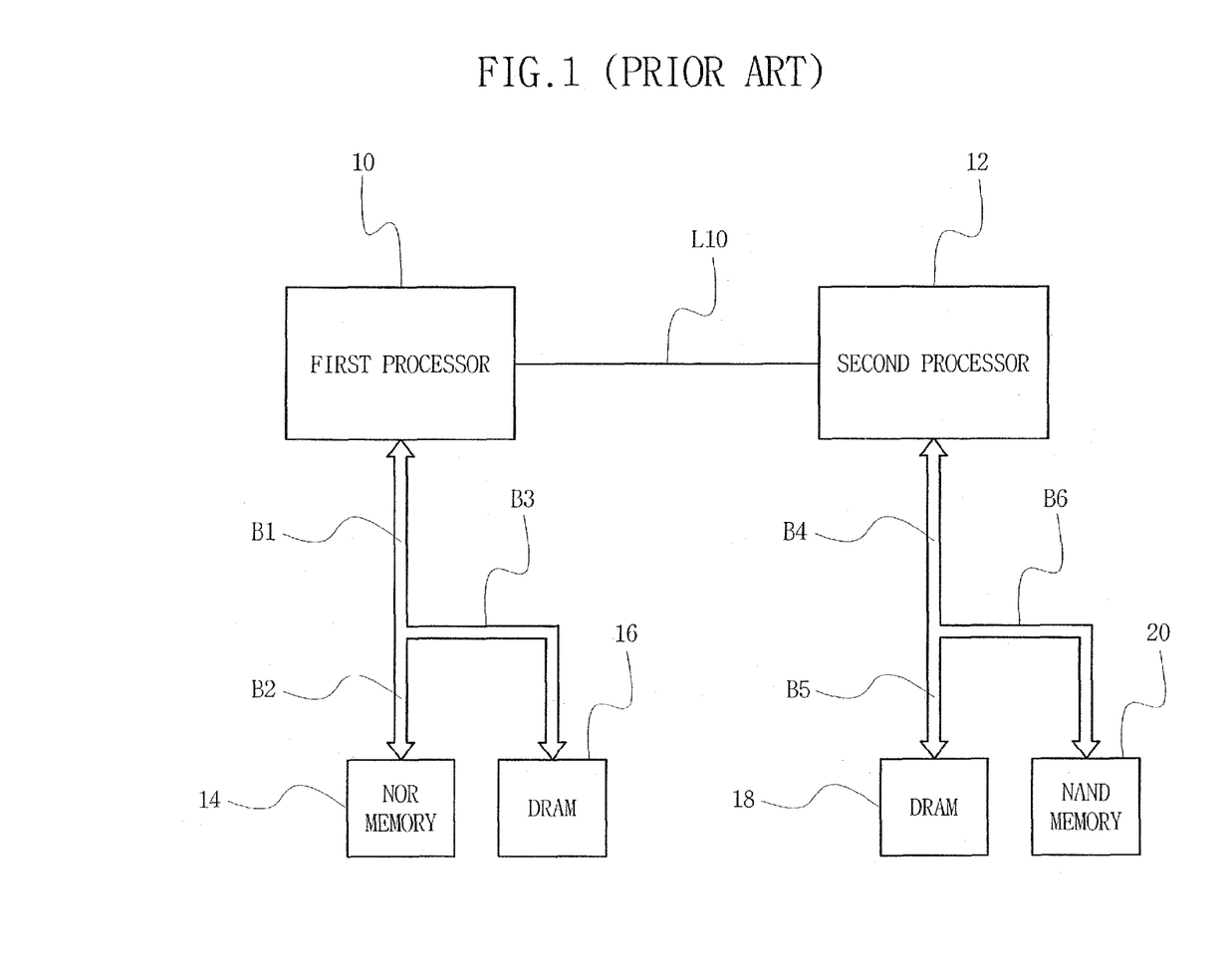
FIG. 1 is a block diagram of a conventional multiprocessor system used in a portable communication device.

Referring to FIG. 1, a first processor 10 is connected with a second processor 12 through a connection line L10. A NOR memory 14 and a first DRAM 16 are coupled to the first processor 10 through set buses B1 through B3. A second DRAM 18 and a NAND memory 20 are coupled to the second processor 12 through set buses B4 through B6. The first processor 10 may have a modem function for modulating and demodulating communication signals. The second processor 12 may have an application function for processing communication data or executing games, providing entertainment, and so on. The NOR memory 14 has a NOR cell array structure. The NAND memory 20 has a NAND cell array structure. Both are non-volatile memories having transistor memory cells with floating gates, and may be used to store data, such as a native code or data of the portable appliance that should not be erased even when power is turned off. The first and second DRAMs 16 and 18 act as main memories for the first and second processors, respectively.

Figure 2:
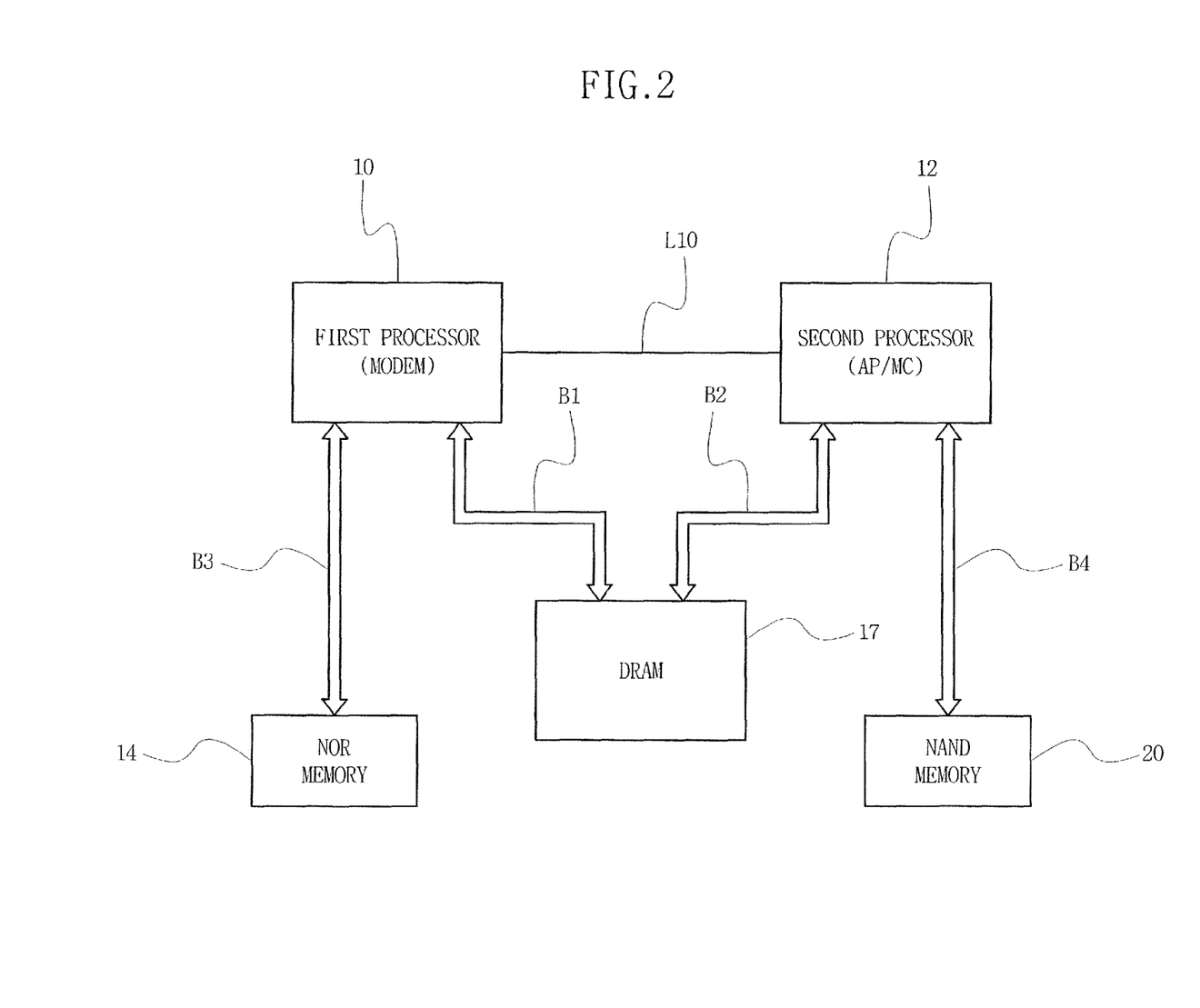
FIG. 2 is a block diagram of a multiprocessor system using memories according to an embodiment.

However, in the multiprocessor system as in FIG. 1, the DRAMs are correspondingly allocated to both the processors, and relatively low-speed interfaces, such as universal asynchronous receiver transmitter (UART), serial peripheral interface (SPI), static random access memory (SRAM) interfaces. Hence, it is difficult to secure a sufficient data transmission speed, size is increased and memory component costs are increased. A scheme for reducing an occupied size, enhancing a transmission speed, and decreasing the number of employed memories is shown in FIG. 2. A multiprocessor system of FIG. 2 is characterized in that one DRAM 17 is connected to first and second processors 10 and 12 through buses B1 and B2 respectively, in contrast to that of FIG. 1. In order for each of the processors to access one DRAM 17 through two separate paths, two ports are required on the DRAM 17. However, the DRAM 17 is generally a device having a single input/output path part 16 and a single port PO, as shown in FIG. 3.

Figure 3:
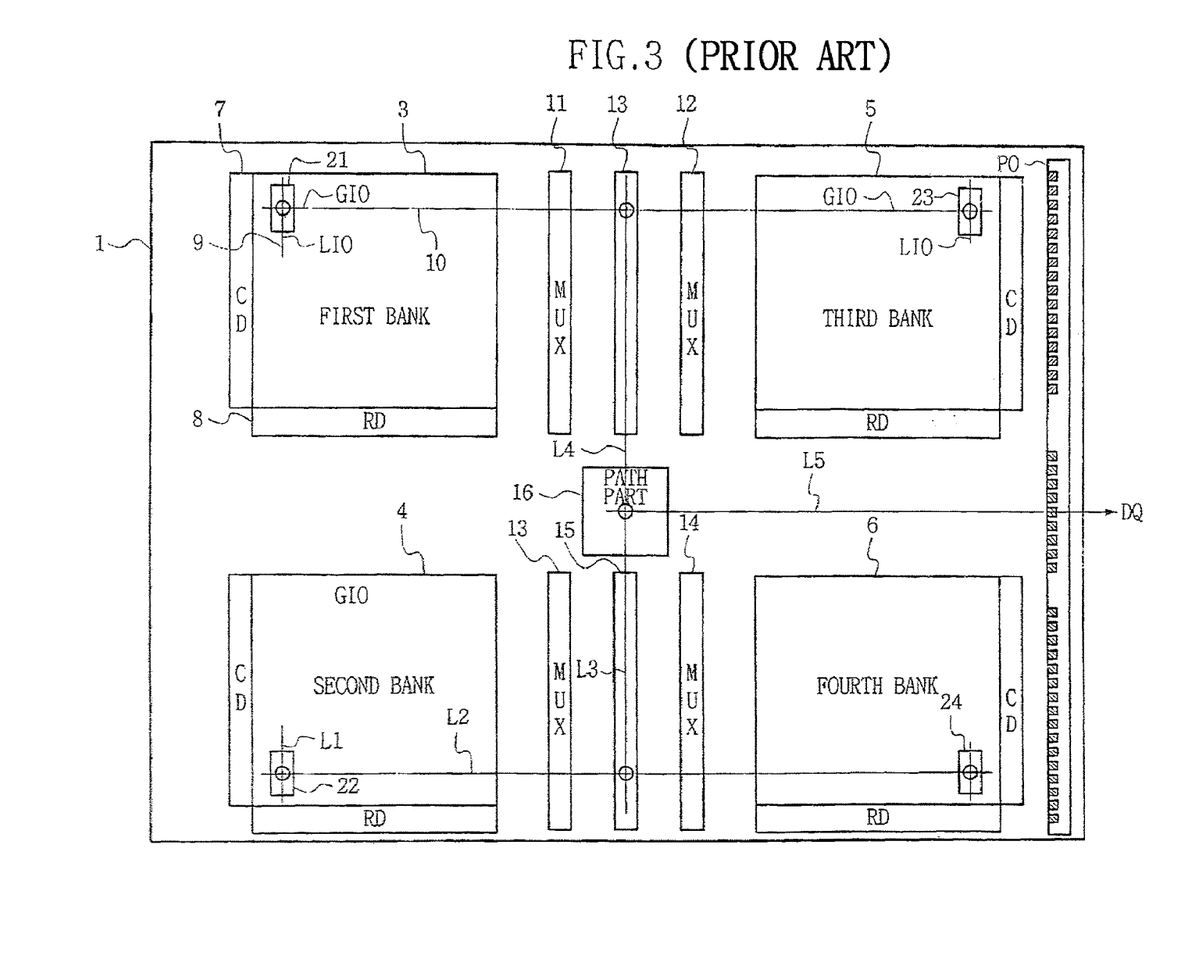
FIG. 3 is a block diagram illustrating the internal structure of a memory cell array in a conventional DRAM.

FIG. 3 shows a structure of the general DRAM. A memory cell array 1 includes first to fourth banks 3, 4, 5 and 6, each of which includes a row decoder 8 and a column decoder 7. An upper input/output sense amplifier and driver 13 is operatively connected with the first bank 3 and the third bank 5 through multiplexers 11 and 12. A lower input/output sense amplifier and driver 15 is operatively connected with the second bank 4 and the fourth bank 6 through multiplexers 13 and 14.

For example, when a memory cell in the first bank 3 is selected to read data stored in the selected memory cell, a process of outputting the read data is as follows. First, the data of the memory cell, which is sensed and amplified by a bit line sense amplifier in the cell array after a selected word line is activated, is transmitted to a local input/output line pair 9 by activation of a corresponding column select line (CSL). The data transmitted to the local input/out line pair 9 is transmitted to a global input/output line pair 10 by a switching operation of a first multiplexer 21, and the second multiplexer 11 connected to the global input/output line pair 10 transmits the data of the global input/output line pair 10 to the upper input/output sense amplifier and driver 13. The data, which is again sensed and amplified by the upper input/output sense amplifier and driver 13, is output to a data output line L5 through the path part 16. Similarly, when data stored in the memory cell of the fourth bank 6 is read, the data is output to an output terminal DQ through a multiplexer 24, the multiplexer 14, the lower input/output sense amplifier and driver 15, the path part 16, and the data output line L5 in that order. Thus, the DRAM 1 of FIG. 3 has a structure in which two banks share one input/output sense amplifier and driver. In addition, the DRAM 1 is a single port memory in which the data is input/output through one port PO. Consequently, the DRAM 1 of FIG. 3 may be used in the system of FIG. 1, but it is difficult or impossible to be used in the multiprocessor system of FIG. 2 due to the structures of the memory bank and port.

Figure 4:
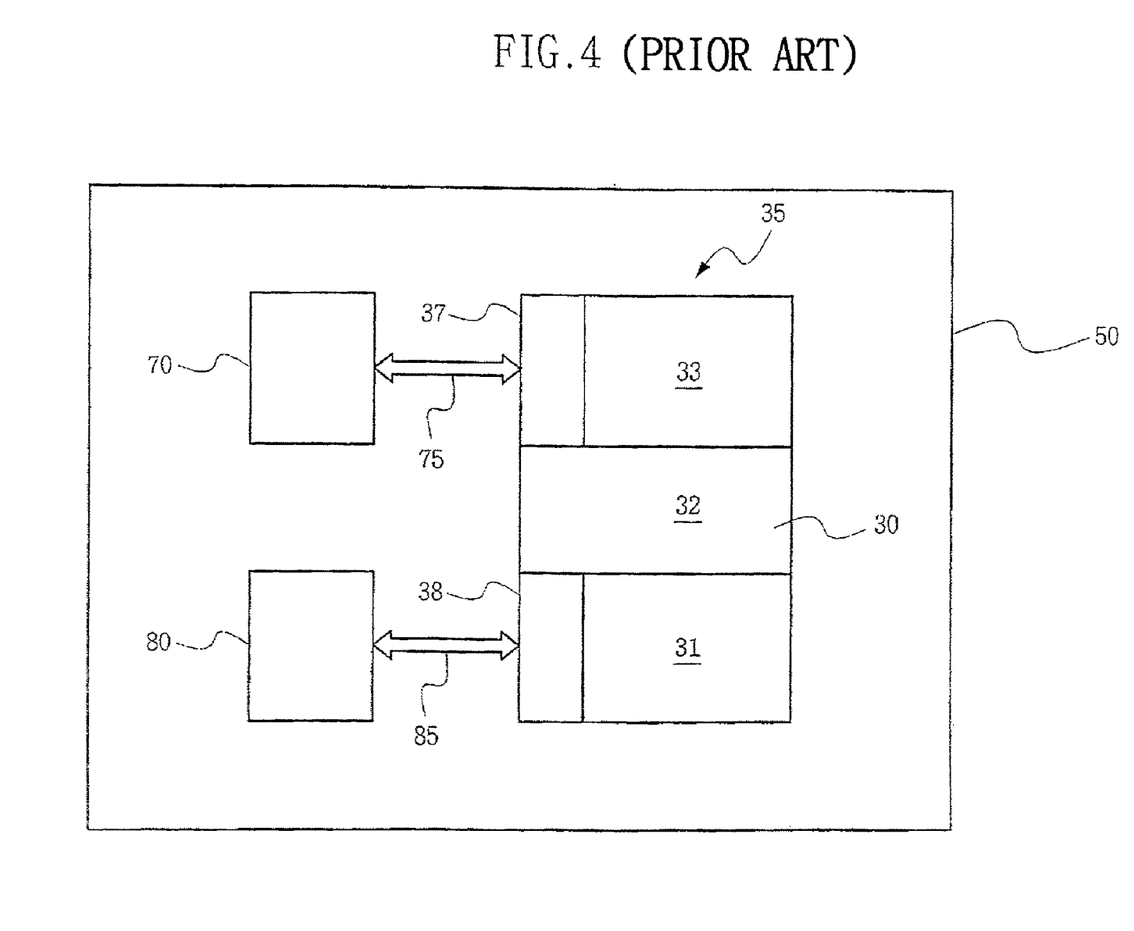
FIG. 4 is a block diagram illustrating memory array portions of a conventional multiprocessor system.

Referring to FIG. 4, there is shown a multiprocessor system in which a memory array 35 has first, second and third portions. The first portion 33 of the memory array 35 is accessed only by a first processor 70 through a port 37, the second portion 31 is accessed only by a second processor 80 through a port 38, and the third portion 32 is accessed by both the first and second processors 70 and 80. Sizes of the first and second portions 33 and 31 of the memory array 35 can be flexibly varied depending on operation loads of the first and second processors 70 and 80. The memory array 35 may be realized as a memory or a disk storage.

When implementing the third portion 32, shared by the first and second processors 70 and 80 in the DRAM structure, several problems may arise. For example, a technique of arranging the memory regions and input/output sense amplifier in the memory array 35 and controlling a proper read/write path with respect to each port is needed. Furthermore, a processor may require the memory region to be extended. For example, a storage capacity (or a memory capacity) of data that the second processor 80 can read or write in order to provide moving pictures or various multimedia needs increasing.

Thus, in the multiprocessor system having at least two processors, there is a need for a more appropriate solution for sharing the shared memory region allocated in the DRAM memory cell array, as well as an improved method of making it possible to additionally extend the capacity of memory as much as desired in the system when the specific processor requires to extend the memory region.

SUMMARY

An embodiment includes a multiprocessor system including a first processor coupled to a first bus, a second processor coupled to a second bus, a first memory coupled to the first bus and the second bus, and a second memory coupled to the second bus. The first processor is configured to access the first memory through the first bus, and the second processor is configured to access the first memory and the second memory through the second bus.

Another embodiment includes a multiprocessor system including a first processor coupled to a first bus, a second processor coupled to a second bus, a first memory coupled to the first bus and the second bus, and at least one memory receptacle coupled to the second bus. The first processor is configured to access the first memory through the first bus, and the second processor is configured to access the first memory and any memory installed in the memory receptacle through the second bus.

BRIEF DESCRIPTION OF THE DRAWINGS

The above and other features and advantages will become more apparent to those of ordinary skill in the art by describing embodiments in detail with reference to the attached drawings in which.

DETAILED DESCRIPTION

Hereinafter, embodiments of a memory expansion structure in a multi-path accessible semiconductor memory device suitable to be used in a multiprocessor system will be described with reference to the accompanying drawings.

In the following detailed description, numerous specific details of embodiments are set forth by way of examples with reference to the figures. However, it should be noted that embodiments may take other forms and are provided to help those skilled in the art obtain a thorough understanding of the scope of the claims. Furthermore, well-known methods, procedures, such as ordinary dynamic random access memories and internal circuits have not been described in detail so as not to cause confusion.

Figure 5:
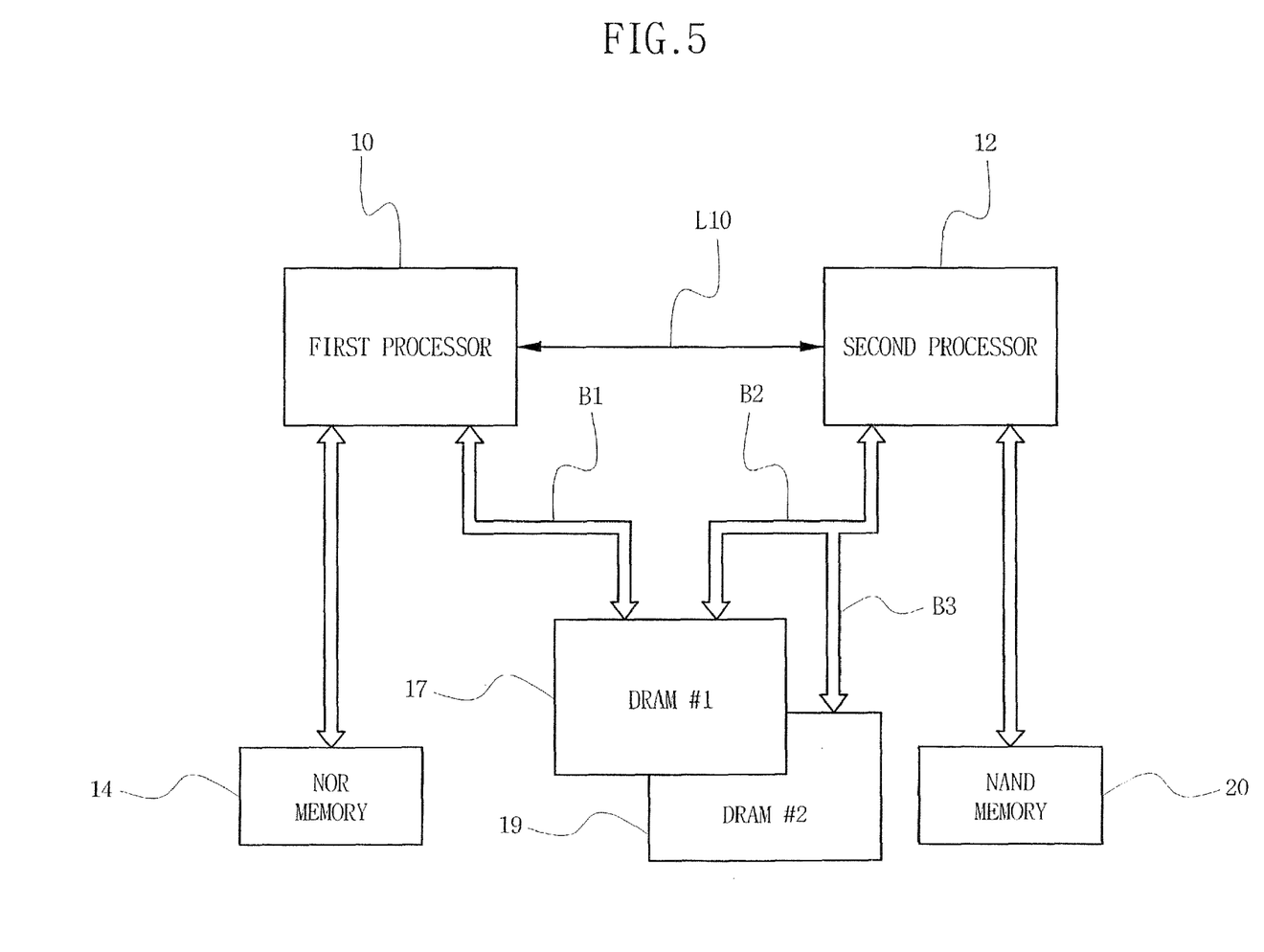
FIG. 5 is a block diagram of a multiprocessor system having a multi-path accessible DRAM and extended DRAM according to an embodiment.

FIG. 5 is a block diagram of a multiprocessor system having a multi-path accessible DRAM and extended DRAM according to an embodiment. The multiprocessor system includes a first processor 10 to perform a first setup task, a second processor 12 to perform a second setup task, a multi-path accessible DRAM 17 and a single-path accessible DRAM 19 which have memory regions in a memory cell array. Furthermore, the multiprocessor system may include a NOR memory 14 and a NAND memory 20 which are connected to the first processor 10 and the second processor 12, respectively.

The multi-path accessible DRAM 17 coupled with the first and second processors 10 and 12 through the system buses B1 and B2 respectively, and has at least one shared memory region in the memory cell array and dual access ports. In other words, the multi-path accessible DRAM 17 is a first memory, having at least one shared memory region accessible by both the first and second processors 10 and 12 through first and second ports that are correspondingly connected to the system buses B1 and B2.

The single-path accessible DRAM 19 is coupled to the second processor 12 through the system bus B3, and includes an ordinary single port memory having a dedicated memory region as in FIG. 3. Thus, the single-path accessible DRAM 19 is a memory that may increase a memory capacity of the second processor 12, and may be accessed only by the second processor 12.

Figure 6:
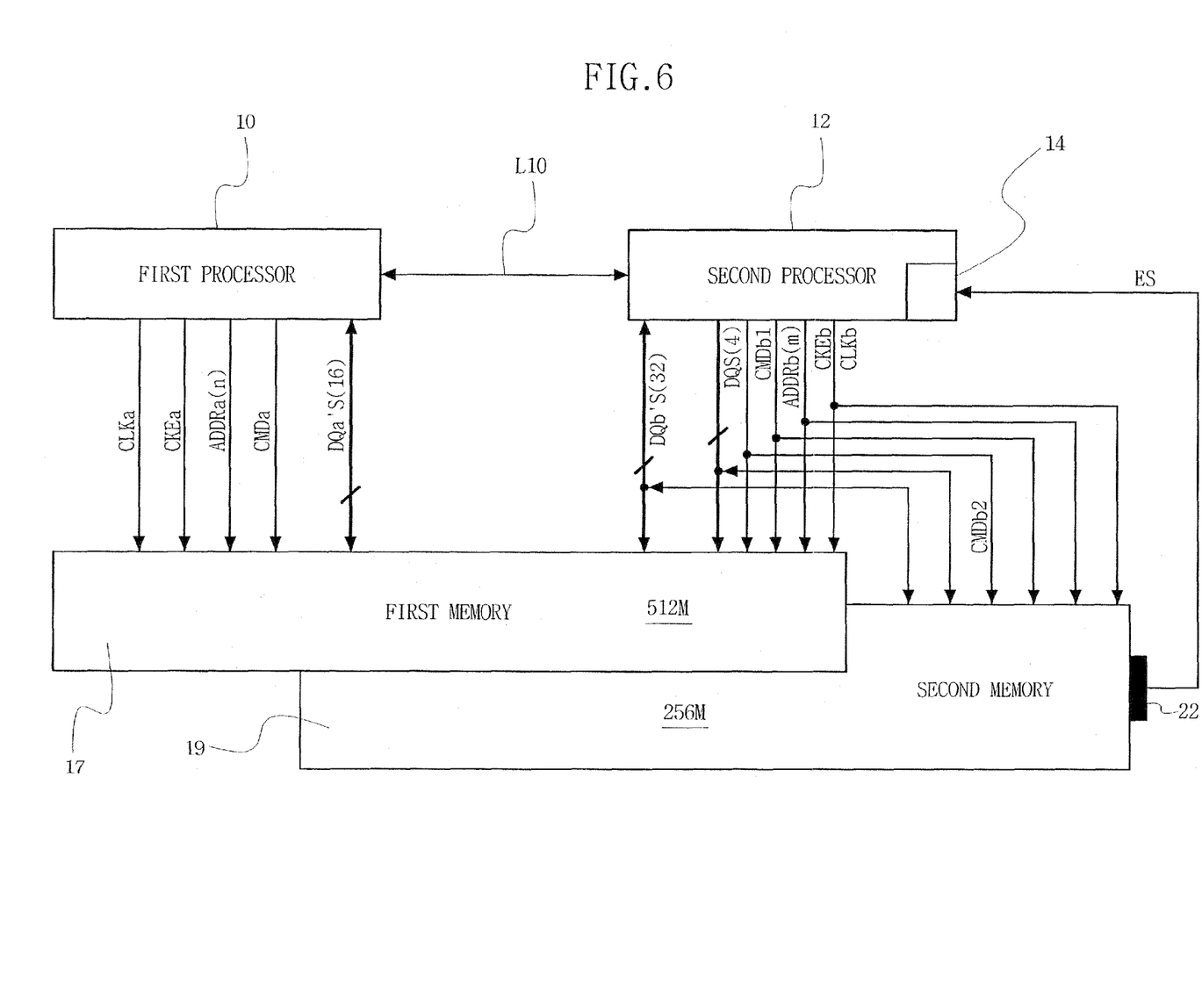
FIG. 6 is a system block diagram illustrating an example of a memory extension structure in FIG. 5.
Figure 7:
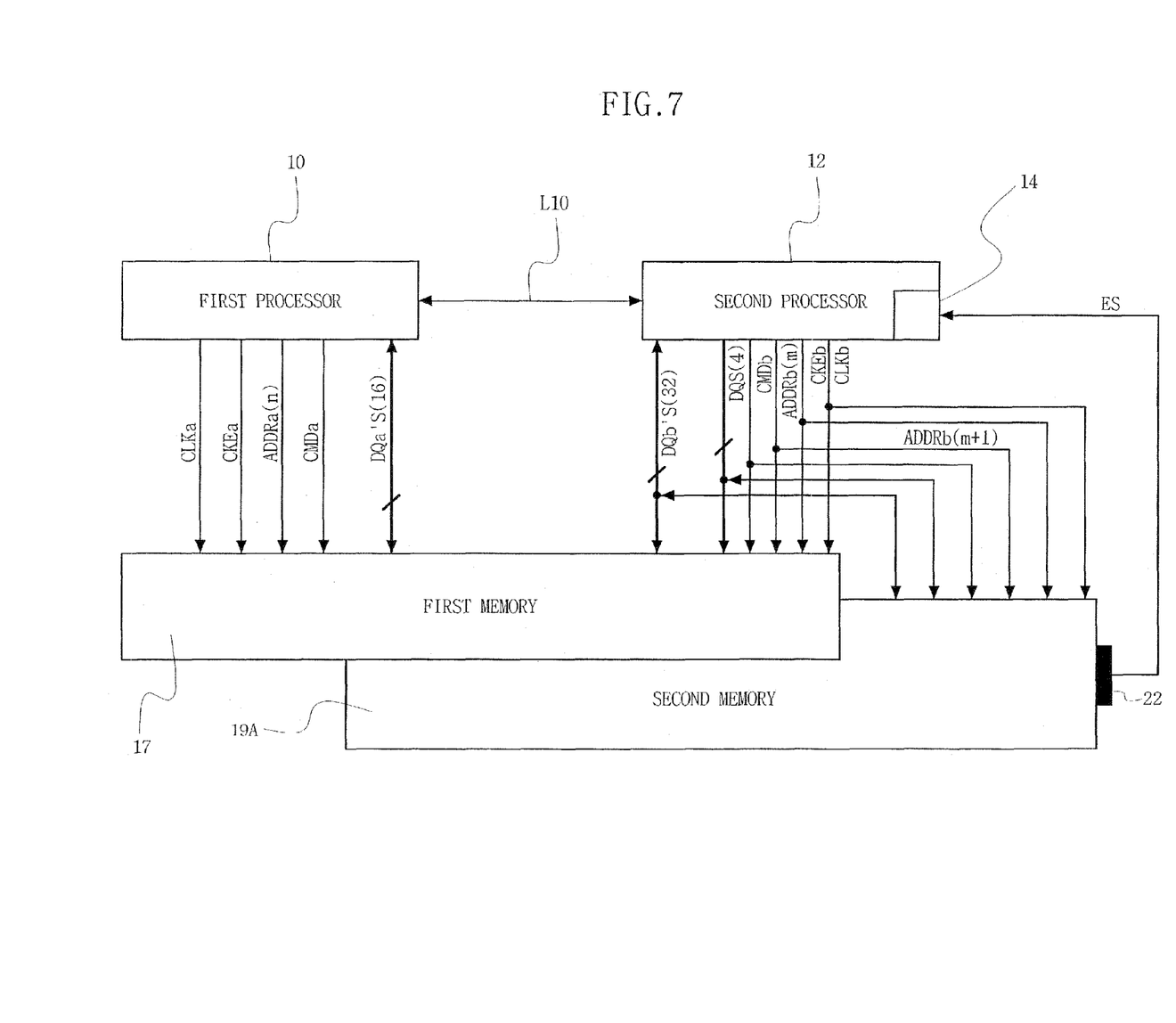
FIG. 7 is a system block diagram illustrating another example of a memory extension structure in FIG. 5.

The system bus of the second processor 12 is commonly coupled to ports of the first and second memories 17 and 19, as shown in FIGS. 6 and 7.

There are many uses for a system having the extended memory structure as in FIG. 5. For example, a current portable system such as a portable multimedia player (PMP) may use such an extended memory structure. More and more services are available for PMPs. Such services include surveying today's share status, watching a movie, playing a game or entertainment, performing Internet surfing, giving an order for products to an online shopping mall such as an Interpark, exchanging mails, providing navigation based on a road map, etc. when walking along the road, going to business, making a train or bus journey, going to or leaving the office, enjoying an open-air leisure, going to a skiing ground, going fishing, and so on. As a result, a PMP may need more memory than when initially supplied to the user. Thus, the extended memory capacity for the second processor 12 may be used to address this need.

When the memory regions in the multi-path accessible DRAM 17 of FIG. 5 have the same arrangement as the four memory regions 3 through 6 of FIG. 3, at least one memory region (e.g. the shared memory region 3) can be accessed by both the first and second processors 10 and 12. Furthermore, a dual port structure is needed with an additional port PO installed on the left side as well as the right side illustrated in FIG. 3. Thus, while not shown in FIG. 3, the first memory region 3 becomes a shared memory region accessible by both the first and second processors 10 and 12 through their own ports, whereas the second to fourth memory regions 4, 5 and 6 become dedicated memory regions accessed by the first processor 10 alone.

Each of the four memory regions 3 through 6 may be a bank of the DRAM. Each bank can have a storage capacity of, for instance, 64 Mbit, 128 Mbit, 256 Mbit, 512 Mbit, or 1024 Mbit. Memory cells may be arranged in the memory regions in matrix or row and column form. Each memory cell may include one access transistor AT and storage capacitor C.

When the first processor 10 accesses the shared memory region through the first port, the second processor 12 can access any one of the other memory regions through the second port at substantially the same time. This multi-path access operation is shown in detail in FIG. 5, but it is implemented by a control circuit in the memory controlling the access path in a proper way.

In one example, the first processor 10 of FIG. 5 can have a modem function for modulating and demodulating communication signals or a base band processing function as a processing task, and the second processor 12 can have an application function for processing communication data or executing games, displaying video, or other entertainments as a processing task. Furthermore, the system bus B1 may be set to 16 bits. The system bus B2 may be the same or may be different. For example, the system bus B2 may be set to 16 bits (x16) or 32 bits (x32).

The NAND memory 20 is a non-volatile memory having a NAND cell array structure. A NAND memory cell may include a metal oxide semiconductor (MOS) transistor having a floating gate, and thus used as a flash memory cell. The flash memory cell may be used for storing data, such as the native code and data of a portable appliance that should not be erased even when power is turned off. While illustrated to be connected to the first processor 10 in the system of FIG. 5, data may be moved from the NAND memory 20 to the NOR memory 14, and vice versa. Then, one of the NAND memory 20 and the NOR memory 14 may be removed when the data is transferred to the other memory.

The system of FIG. 5 may be a portable computing device such as a mobile communication device (e.g. a cellular phone), a bidirectional radio communication system, a unidirectional pager, a bidirectional pager, a personal communication system, or a portable computer, a portable multimedia player, or a portable communication device. However, it should be understood that the scope and application of the claims are not limited to these devices.

Furthermore, in the system of FIG. 5, the number of processors can be extended to three or more. The processors of the system can be, for example, a microprocessor, a central processing unit (CPU), a digital signal processor, a microcontroller, a reduced command set computer, a complex command set computer, or the like. However, it should be understood that the scope of the claims is not limited to a particular number of processors in the system. Furthermore, the scope of the claims is not limited to a specific combination of processors, regardless of whether the processors are the same or different.

A method in which the second processor 12 accesses (reads or writes) the DRAM 17 and the extended DRAM 19 illustrated in FIG. 5 will be described with reference to the attached figures. One of ordinary skill in the art will understand that the method may be implemented by other systems.

FIG. 6 is a system block diagram illustrating an example of a memory extension structure in FIG. 5. FIG. 7 is a system block diagram illustrating another example of a memory extension structure in FIG. 5. The extension structure of FIG. 6 employs a scheme in which accesses of the first and second memories 17 and 19 are distinguished by the second processor 12 using different commands. Furthermore, the extension structure of FIG. 7 employs a scheme in which accesses of the first and second memories 17 and 19A are distinguished by the second processor 12 using different addresses.

Figure 8:
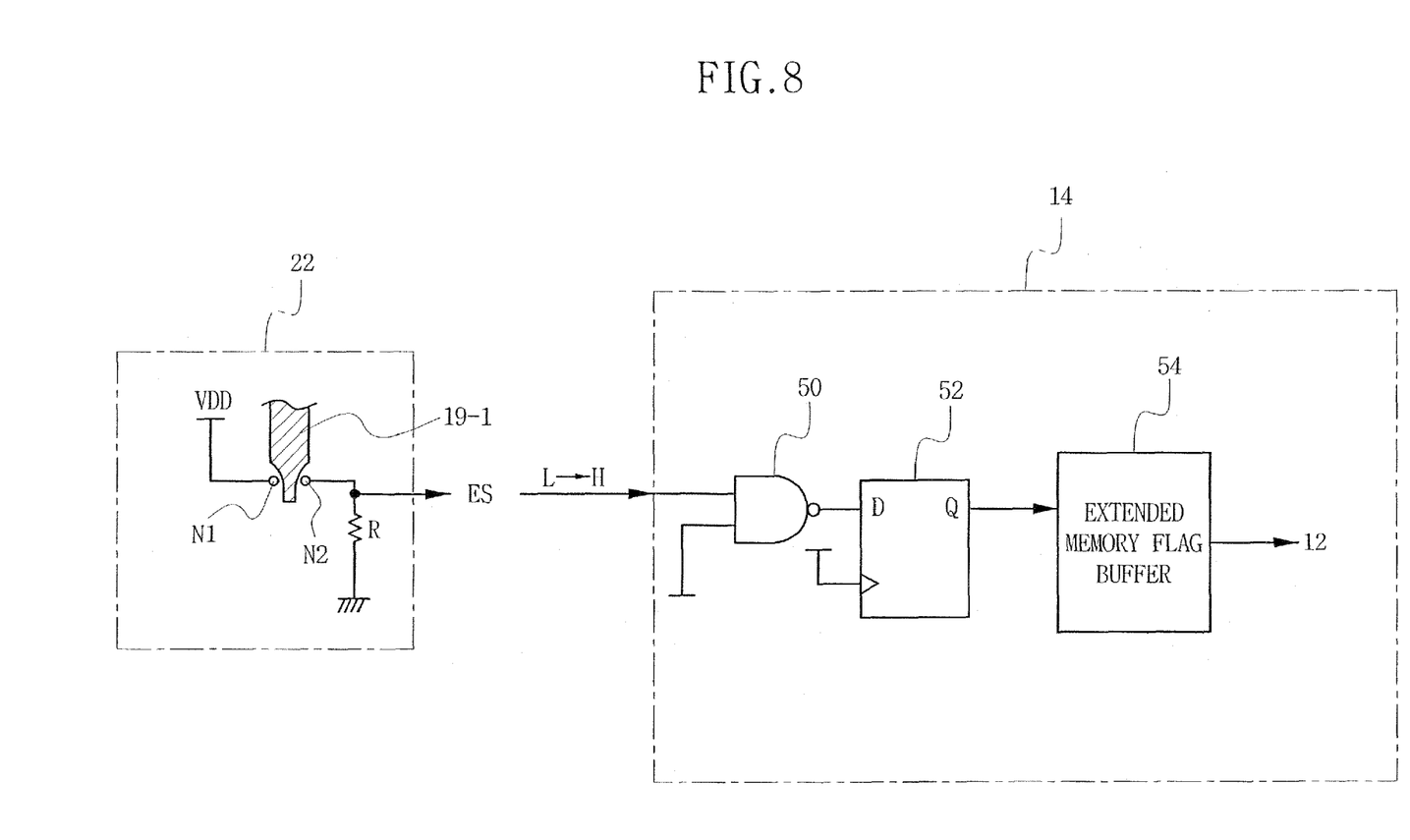
FIG. 8 is a detailed circuit diagram of an extended monitoring part illustrated in FIG. 6 or 7.

FIG. 8 is a detailed circuit diagram of an extended monitoring part illustrated in FIG. 6 or 7. Referring to FIG. 8, an extended monitoring part includes an extended detecting section 22 and an extended flag setting section 14. As illustrated in FIG. 6 or 7, the extended detecting section 22 constituting the extended monitoring part may be provided on a system board such as a printed circuit board, while the extended flag setting section 14 may be installed inside or outside the second processor 12. The extended detecting section 22 outputs a logic of a memory extension detecting signal ES to a high level when the second memory is mounted. For example, any one of the connector pins of the second memory or a user's setup pin (e.g. a pin for adjusting the setup of the system board when extending a capacity of the memory) connects terminals N1 and N2 installed between a supply voltage VDD and a ground voltage.

The extended flag setting section 14 includes a NAND gate 50, a flip-flop 52, and an extended memory flag buffer 54, and has a wiring structure as in FIG. 8. When the second memory 19 or 19A is mounted on the system board, the extended flag setting section 14 sets an extended memory flag in a logic low or high state. Thus, the second processor 12 can recognize a capacity of the memory which the second processor 12 can access by checking a state of the extended memory flag.

As described above in FIG. 6, accesses of the first and second memories 17 and 19 can be distinguished by using different commands and in FIG. 7, accesses of the first and second memories 17 and 19 can be distinguished by using different addresses.

In FIG. 6, when a first memory command CMDb1 is applied on command lines CMDb, the first memory 17 is accessed. When a second memory command CMDb2 is applied, the second memory 19 is accessed. In this case, various lines of signals CLKb, CKEb and ADDRb(m) and data DQS(4) and DQb'S(32) of the second processor 12 are commonly connected to the first and second memories 17 and 19. The first memory command CMDb1 can include a chip select signal CS1b, a row address strobe signal RASb, a column address strobe signal CASb, a write enable signal Web, and an output enable signal DQMb. The second memory command CMDb2 can include a chip select signal CS2b, a row address strobe signal RASb, a column address strobe signal CASb, a write enable signal Web, and an output enable signal DQMb.

In FIG. 7, when a first memory address ADDRb(m) is applied, the first memory 17 is accessed. When a second memory address ADDRb(m+1) is applied, the second memory 19 is accessed. In this case, various lines of signals CLKb, CKEb and ADDRb(m) and data DQS(4) and DQb'S (32) of the second processor 12 are commonly connected to the first and second memories 17 and 19A. Here, a command CMDb can include a chip select signal CS1, a row address strobe signal RASb, a column address strobe signal CASb, a write enable signal Web, and an output enable signal DQMb.

In order to enable the first memory 17 illustrated in FIGS. 5, 6 and 7 to be accessed by both the first and second processors 10 and 12, input/output sense amplifier and write drivers can be disposed in the shared memory region of the first memory 17 on left and right sides of the cell array respectively, and first and second global multiplexers having switching operations opposite to each other can be disposed next to the input/output sense amplifier and write drivers.

Returning to FIGS. 3 and 5 again, the first and second processors 10 and 12 makes common use of circuit elements and lines between the ordinary global input/output line pair GIO and GIOB and the memory cell when the access operation is performed, and makes independent use of circuit elements and lines associated with input/output from each port to the global multiplexer.

More specifically, it should be noted that, as illustrated in FIG. 3, the global input/output line pair GIO and GIOB, the local input/output line pair LIO and LIOB that is operatively connected to the global input/output line pair, the bit line pair BLi and BLBi that is operatively connected to the local input/output line pair by the column select signal CSL, the bit line sense amplifiers that correspond to the bit line pair BLi and BLBi and sense and amplify data of the bit lines, and the memory cells to which the access transistors forming the memory cells on the bit line pair are connected, all of which are disposed in the shared memory region. The circuitry of FIG. 3 is shared by each of the first and second processor 10 and 12 through the first and second ports.

Although, while not described in FIG. 5, it is necessary for the row and column address multiplexers to be installed at front ends of the row and column decoders, and to receive row and column addresses from the port whose occupation is allowed. Such address multiplexers can be realized by a clocked complementary metal oxide semiconductor (CMOS) inverter composed of N-type and P-type MOS transistors.

Referring to FIGS. 3 and 5 together, an operation of the first processor 10 accessing the dedicated memory region in the first memory 17 is the same as that of the ordinary processor accessing the data.

Meanwhile, when the second memory 19 is extended on the system board as in FIG. 6, the second processor 12 recognizes that the second memory 19, the dedicated memory, is extended by checking the state of the extended memory flag of the extended flag setting section 14. Here, assuming that the second processor 12 accesses the first memory region 3 of the shared bank in the first memory 17, and that an operation mode at that time is a read operation, the active command CMDb1 and read command are applied into the first memory 17 through the second port of the first memory 17 to which the second processor 12 is connected. When the row address is applied, a word line WLi in the shared memory region which the second processor 12 wants to access is activated. When the word line WLi is activated, the data of the memory cells in which the gates of the access transistors AT are connected to the same word line are developed to the corresponding bit line pair. For example, when the gate of the access transistor AT of a memory cell is supplied with a higher voltage than a threshold voltage by a word line boosting operation, a potential developed to the bit line BLi is varied according to a state of charges (e.g. 1.8 to 3 V in a charged state, and 0 V in an uncharged state) stored in the storage capacitor C. Consequently, a state of charge-sharing operation with the bit line in the charged state is different from that in the uncharged state, and such a difference is sensed and amplified by the bit line sense amplifier in the array. For example, when the potential of the bit line BLi is output to a high level, and when the potential of a bit line bar BLBi, a complementary bit line, is output to a low level, a potential of the bit line pair BLi and BLBi is transmitted to the corresponding local input/output line pair LIO and LIOB for the first time when a column gate responding when the logic level of the column select signal CSL is high is turned on.

After the word line WLi is activated, and then the data of the memory cell is output to the bit line pair BLi and BLBi as the potential of the high or low level, when the column select line is activated by the column decoder for decoding the column address, the potential of the bit line pair BLi and BLBi in the shared memory region is transmitted to the local input/output line pair LIO and LIOB as illustrated in FIG. 3. The data of the local input/output line pair LIO and LIOB which is output as the potential level is transmitted to the global input/output line pair GIO and GIOB as illustrated in FIG. 3 when the N-type MOS transistors constituting the first multiplexer LIO MUX 21 of FIG. 3 are turned on. Here, a switching signal applied in common to gates of the N-type MOS transistors can be a signal generated by responding to a decoding signal output from the row decoder. The data transmitted to the global input/output line pair GIO and GIOB is transmitted to the input/output sense amplifier and driver 13 through the second multiplexer 11 as mentioned above. As illustrated in FIG. 3, the input/output sense amplifier 13 amplifies again the data the level of which is weakened due to the transmission through the foregoing paths, and transmits the amplified data to an output buffer.

Alternatively, assuming that the second processor 12 accesses the dedicated memory region in the second memory 19, and that an operation mode at that time is a read operation, the active commend CMDb2 and read command are applied into the second memory 19 through the single port of the second memory 19 to which the second processor 12 is connected. When the row address is applied, a word line WLi in the dedicated memory region which the second processor 12 wants to access is activated. When the word line WLi is activated, the data of the memory cells in which the gate of the access transistor AT is connected to the same word line are developed to the corresponding bit line pair. The operation of reading the data in the ordinary DRAM is performed, and thus the data is read to the second processor 12.

In the foregoing embodiments, the case where the one single-path memory is extended in parallel at the multi-path access memory is taken by way of example. However, when two or at least three processors are employed to the system, multiple DRAMs may be installed to extend the memory of the system board. Although embodiments have been described with DRAMs, other memory types may be used, such as SRAM, non-volatile memory, and so on.

According to the memory and system as set forth above, multiple processors can smoothly access the shared memory region allocated in the memory cell array. Thus, the speed of transmitting and processing the data is improved, and the system is downsized. In addition, when a capacity of memory is increased, the capacity of memory accessible by specific processors can be easily extended. Hence, the multiprocessor system may offer more improvement to users increasing the competitive advantage of the system in the marketplace.

While particular embodiments have been described, many modifications, substitutions, changes and equivalents will be apparent to those skilled in the art. For example, in alternative embodiments, the bank or circuit configuration and access or extension method in the memory may be variously modified or changed. It is, therefore, to be understood that the appended claims are intended to cover all such modifications and changes as fall within the scope of the claims.

What is claimed is:

1. A multiprocessor system, comprising:
a first processor coupled to a first bus;
a second processor coupled to a second bus;
a first memory coupled to the first bus and the second bus, the first memory having at least one shared memory region in a first chip accessible by both the first and second processors through first and second ports that are correspondingly connected to the first and second buses;
a second memory coupled to a third bus, the second memory coupled to the second processor through the third bus, and including a single port memory having a dedicated memory region in a second chip to increase a memory capacity of the second processor, and being accessed only by the second processor through a third port in the second chip independent of the first chip; and an extended memory monitoring circuit configured to generate an extended memory flag according to whether the second memory is installed.

2. The multiprocessor system of claim 1, wherein:
the second processor is configured to selectively access the first memory and the second memory according to an address on the second bus.

3. The multiprocessor system of claim 1, wherein the second processor is configured to selectively access the first memory and the second memory according to a command on the second bus.

4. The multiprocessor system of claim 1, further comprising:
a third memory coupled to the second processor through a fourth bus, wherein the third memory is a non-volatile memory.

5. The multiprocessor system of claim 1, wherein:
the first memory is configured such that both the first processor and the second processor have access to at least one common memory cell of the first memory.

6. A portable communication system, comprising:
a first processor coupled to a first bus and a second bus;
a second processor coupled to a third bus and a fourth bus;
a first non-volatile memory coupled to the first processor through the first bus;
a second non-volatile memory coupled to the second processor through the third bus;
a first volatile memory coupled to the first processor through the second bus and coupled to the second processor through the fourth bus; the first volatile memory having at least one shared memory region in a first chip accessible by both the first and second processors through first and second ports that are correspondingly connected to the second and fourth buses;
a second volatile memory coupled to the second processor through the fourth bus, the second volatile memory coupled to the second processor through the fourth bus, and including a single port memory having a dedicated memory region in a second chip to increase a memory capacity of the second, processor, and being accessed only by the second processor through a third port in the second chip independent of the first chip; wherein:
the second processor is configured to selectively access the first volatile memory and the second volatile memory through the fourth bus;
the first volatile memory includes a first portion accessible only by the first processor, a second portion accessible only by the second processor, and a third portion accessible by both the first processor and the second processor;
a memory receptacle; and
an extended memory monitoring circuit configured to generate an extended memory flag according to whether the second memory is installed in the memory receptacle.

7. A multiprocessor system, comprising:
a first processor coupled to a first bus;
a second processor coupled to a second bus;
a first memory coupled to the first bus and the second bus, the first memory having at least one shared memory region in a first chip accessible by both the first and second processors through first and second ports that are correspondingly connected to the first and second buses;
at least one memory receptacle coupled to a third bus, the at least one memory receptacle coupled to the second processor through the third bus, and including a single port memory having a dedicated memory region in a second chip to increase a memory capacity of the second processor, and being accessed only by the second processor through a third port in the second chip independent of the first chip; and
an extended memory monitoring circuit configured to generate an extended memory flag according to whether an additional memory is installed in the memory receptacle,
wherein the first processor is configured to access the first memory through the first bus, and the second processor is configured to access the first memory and any memory installed in the memory receptacle through the second bus.

8. The multiprocessor system of claim 7, wherein:
the second processor is configured to selectively access the first memory and any memory installed in the memory receptacle according to an address on the second bus.

9. The multiprocessor system of claim 7, wherein the second processor is configured to selectively access the first memory and any memory installed in the memory receptacle according to a command on the second bus.

10. The multiprocessor system of claim 7, further comprising:
a non-volatile memory coupled to the second processor through a fourth bus.

11. The multiprocessor system of claim 7, wherein:
the first memory is configured such that both the first processor and the second processor have access to at least one common memory cell of the first memory.

* * * * *